United States Patent [19]

Wilt

[11] Patent Number: 4,805,178

[45] Date of Patent: Feb. 14, 1989

[54] PRESERVATION OF SURFACE FEATURES ON SEMICONDUCTOR SURFACES

[75] Inventor: Daniel P. Wilt, Scotch Plains, N.J.

[73] Assignee: American Telephone and Telegraph Company, AT&T Bell Laboratories, Murray Hill, N.J.

[21] Appl. No.: 845,603

[22] Filed: Mar. 28, 1986

[51] Int. Cl.$^4$ ................................................ H01S 3/19
[52] U.S. Cl. ........................................ 372/46; 372/45;
372/48; 372/102; 357/16; 357/17
[58] Field of Search ......................... 372/44, 45, 46, 48,
372/96, 102; 357/17, 16

[56] References Cited

U.S. PATENT DOCUMENTS

| | | | |
|---|---|---|---|
| 4,273,594 | 6/1981 | Heller et al. | 148/33.3 |
| 4,482,423 | 11/1984 | Besomi et al. | 156/622 |
| 4,575,851 | 3/1986 | Seki et al. | 372/46 |
| 4,597,085 | 6/1986 | Mito et al. | 372/46 |

FOREIGN PATENT DOCUMENTS 0092592  5/1984  Japan ..................... 372/50

Primary Examiner—William L. Sikes
Assistant Examiner—Georgia Y. Epps
Attorney, Agent, or Firm—Michael J. Urbano

[57] ABSTRACT

The integrity of surface structural features (e.g., distributed feedback gratings) in Group III-V compound semiconductors are preserved during heating (e.g., subsequent LPE regrowth) by a thin coating containing a transition metal (e.g., Os, Ru and Rh). DFB-DCPBH InP/InGaAsP single frequency lasers made in this way are also described.

8 Claims, 1 Drawing Sheet

PRESERVATION OF SURFACE FEATURES ON SEMICONDUCTOR SURFACES

BACKGROUND OF THE INVENTION

This invention relates to devices having surface features on Group III-V compound semiconductors and, more particularly, to preserving the integrity of such features when they are heated.

Surface features on semiconductors (and other materials) are used to affect the electrical, acoustical or optical properties of devices incorporating the semiconductor. Optical gratings, for example, are an array of parallel grooves formed on the surface of a semiconductor to reflect or filter light of predetermined wavelengths. In one specific application, a distributed feedback (DFB) Group III-V compound semiconductor laser, an optical grating serves as a filter which allows the laser to operate in only a single longitudinal mode (i.e., at a single frequency). To this end, the amplitude and periodicity of the grating are critical. The grating in such lasers is typically formed on the surface of a substrate or epitaxial layer and is then subjected to relatively high temperatures during subsequent growth of epitaxial layers over the grating. The effect of high temperatures during epitaxial growth is to deteriorate the grating shape (i.e., amplitude, spacing) which of course degrades the single-frequency performance of the laser.

Although grating degradation has been couched in terms of subjecting the grating to the temperatures of epitaxial growth, even if such growth were not employed in a particular device application (e.g., in the case of a grating on the top surface of an optical waveguide layer), other high temperature processing steps might also adversely affect the grating's characteristics.

SUMMARY OF THE INVENTION

In accordance with one aspect of my invention, the integrity of surface structural features, such as optical gratings, on Group III-V compound semiconductors is preserved during heating by a thin coating which contains a transition metal. Sub-monolayer coverage has been found effective with coatings containing Os, Ru or Rh. Where liquid phase epitaxial (LPE) growth over the grating is employed, coatings containing Ru or Rh are presently preferred.

In one embodiment of my invention, InP/InGaAsP double channel planar buried heterostructure (DCPBH) single frequency lasers operating at 1.55 $\mu$m have been fabricated by forming the grating on an InP substrate and then coating the grating with a Ru-containing layer before LPE growth of the heterostructure.

BRIEF DESCRIPTION OF THE DRAWINGS

My invention, together with its various features and advantages, can be readily understood from the following, more detailed description taken in conjunction with the accompanying drawing, in which.

DETAILED DESCRIPTION

Figure 1:
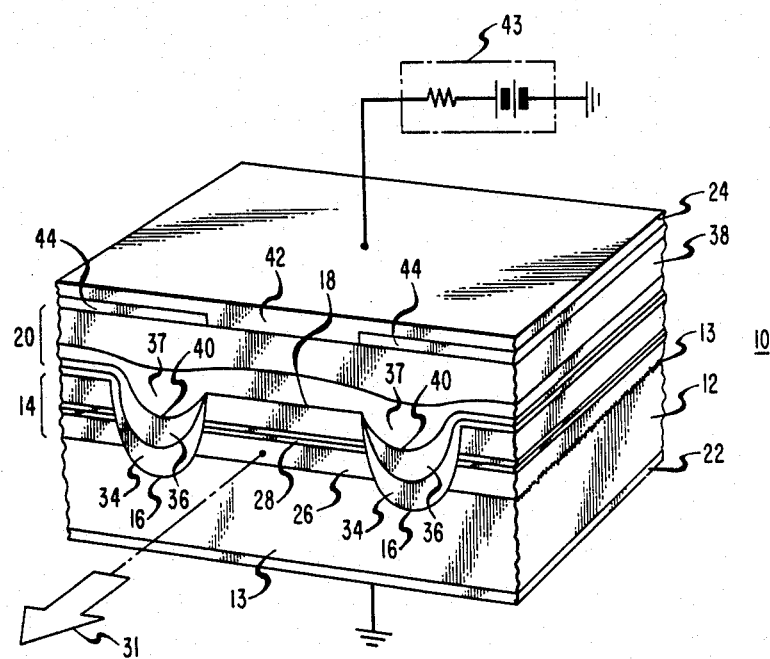
FIG. 1 is a schematic of a DCPBH laser in accordance with one embodiment of my invention.

Turning now to FIG. 1, there is shown a DCPBH laser 10 comprising an InP body (e.g., an n-InP (100)-oriented substrate 12) on which a grating 13 (FIG. 2) is formed so as to effect single frequency operation. Alternatively, an n-InP buffer layer may be grown on the substrate with the grating formed on the buffer layer. The grating lines run parallel to the (01$\bar{1}$) direction, which is also parallel to the laser mirror facets, and may be formed by any means well known in the art. A suitable technique includes holographic exposure of photoresist on the substrate and chemical etching of the substrate material. A multilayer base structure 14 is grown by LPE on the grating and a pair of channels 16 are etched in the base structure 14 so as to form a mesa 18 which includes the active, light-emitting layer 28 of the laser. Thereafter, an embedding structure 20 is epitaxially grown in the channels and over the mesa. Metal contacts 22 and 24 are then formed on the substrate 12 and on the top of the embedding structure 20, respectively.

The base structure (FIG. 2) illustratively includes an n-InGaAsP waveguide layer 26 on the substrate, an undoped (or unintentionally doped) InGaAsP active layer 28, an optional anti-meltback InGaAsP ($\lambda \approx 1.3$ $\mu$m) layer 30 (used in longer wavelength lasers such as those operating at $\lambda \gtrsim 1.5$ $\mu$m), and a p-InP cladding layer 32. The actual wavelength of operation depends on the composition of active layer 28 and is generally in the range of about 1.1 $\mu$m to 1.6 $\mu$m (typical about 1.3 $\mu$m or 1.5 $\mu$m depending often on the type of optical fiber used in conjunction with the laser). The bandgap of the waveguide layer 26 is greater than that of the active layer 28 so that light generated in the active layer is coupled to and guided in layer 26. Alternatively, the anti-meltback layer 30 may also serve as a waveguide layer.

In one embodiment, the embedding structure 20 (FIG. 1) includes p-InP layers 34 and n-InP layers 36 which confine current to flow predominantly through the mesa 18, a p-InP layer 37 which covers the channels and the mesa 18, and a p-InGaAsP or p-InGaAs cap or contact-facilitating layer 38. The interfaces between p-type layers 37 and n-type layers 36 form p-n junctions 40 which are reverse biased with the device is forward biased during operation. Junctions 40 thus block substantial current flow around the mesa and cause most of the pump current from source 43 to flow through the mesa and hence through the active layer 28. Light generated in the active layer 28 is coupled into the wider bandgap, waveguide layer 26 and is emitted as a beam in the general direction of arrow 31.

An alternative to the reverse-biased junctions 40, which block current flow imperfectly and at times inadequately in high speed (bit rate) applications, is to use metal-organic chemical vapor deposition (MOCVD) to regrow semi-insulating Fe-doped InP in the channels as discussed in co-pending application Ser. No. 621,071 filed on June 15, 1984 (Johnston-Long-Wilt).

In the case of either embedding structure, it may be desirable to configure the top contact 24 in the form of a stripe to further constrain current to flow predominantly through the mesa 18. As shown in FIG. 1, the stripe 42 may be delineated by suitable masking via dielectric layers 44.

In accordance with one embodiment of my invention, after the grating is formed and before LPE growth of the base structure thereon, a thin coating containing a transition metal is formed on the grating. Sub-monolayers of Ru or Rh are effective to protect the shape of the grating from significant degradation during LPE growth processes which typically involve temperatures in the range of about 550° C. to 700° C.

Other transition metal coatings, such as those containing Os, also protect the grating from the adverse effects of high temperatures, but may not have wetting characteristics as desirable as the Rh or Ru-containing coatings for LPE growth. Thus, Os-containing coatings may be used on, for example, the top surface of optical waveguides where LPE growth thereon is not an issue but where heating may still cause a grating integrity problem. Such heating could arise, for example, where the waveguide is part of an integrated optical circuit which includes a device that itself involves high temperature processing (e.g., LPE growth or contact alloying).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, another aspect of my invention is a process by which the protective coating is formed on the grating or other surface structural feature. An aqueous solution comprising a transition metal salt dissolved in an acid is applied to the grating to form the coating thereon. In one embodiment the salts are trichlorides of Os, Rh or Ru and the acid is HCl. However, other transition metal salts in conjunction with other acids are expected to be suitable. Moreover, although certain embodiments and examples of my invention are described in the context of LPE, the transition metal coating can also be used in conjunction with other epitaxial techniques such as vapor phase epitaxy. In each case, after the coating is formed, the grating or other structural surface feature may be subjected to heating without experiencing significant degradation.

In addition, although the invention has been described in terms of gratings on InP, it may also be employed to protect structural features on other Group III-V compounds such as InGaAsP.

The following examples are described by way of illustration only and, unless otherwise stated, the specification of various parameters is not intended to limit the scope of the invention.

EXAMPLE I

In this example, we used a holograph and chemical etching to produce second order feedback gratings having grooves parallel to the (01$\bar{1}$) crystal direction of InP wafers (substrates). The dimensions of the grating were: spacing about 0.464 $\mu$m; height about 0.2 $\mu$m. The nominal surface orientation of the InP was (100) with an accuracy of 0.2°. All wafers were n-type material with doping ranging from about $3\times10^{17}$ to $3\times10^{18}$/cm$^3$. Wafers fabricated by both a vertical gradient freeze (Gault) process and a liquid encapsulated Czochralski (LEC) process were used. No dependence upon substrate orientation, doping, or growth method was observed.

All wafers were cleaned by first boiling in chloroform, acetone, and methanol to remove organic contaminants and then etching in 10:1:1 ($H_2SO_4:H_2O_2:H_2O$) at room temperature for one minute. The wafer was then thoroughly rinsed in deionized water and dried under a stream of nitrogen gas. A protective coating was formed on the grating by application of a few drops of an aqueous solution of a transition metal salt to fully cover the wafer surface. After about 5 seconds, this solution was removed by a thorough deionized water rinse. The wafer was then blown dry in a stream of filtered nitrogen, and transferred into an epitaxial growth reactor for either heat treatment or LPE growth.

Solutions of salts of the transition metal ions Ru, Rh, and Os were used. Ru and Rh were contained in 0.1M solutions of their trichlorides in 0.2M HCl. Os was contained in a 0.05M solution of its trichloride in 0.2M HCl.

In this example, the wafer with its etched grating and protective coating were subjected to a heat treatment in an LPE system. The heat treatment cycle, which simulated the growth of a 1.55 $\mu$m planar laser structure for use in making DFB-DCPBH lasers, involved heating the wafer to 600° C. or 90 minutes (corresponding to the conditions which would be used to homogenize the growth melts) followed by ramping to 580° C. over a period of 30 minutes (corresponding to conditions which would be used to grow the double heterostructure). During heating, the wafer was protected from thermal degradation by an overpressure of phosphorus supplied from a solution of InP, Sn, and InAs, in a chamber of the type described by P. Besomi et al in U.S. Pat. No. 4,482,423 issued on Nov. 13, 1984.

As a result of the protective coating, essentially no deformation of the grating etched surface through the heat treatment occurred, while a control sample with a grating having no coating exhibited significant degradation. Similar results were obtained for gratings on wafers coated from solutions of Ru, Rh or Os.

EXAMPLE II

Figure 2:
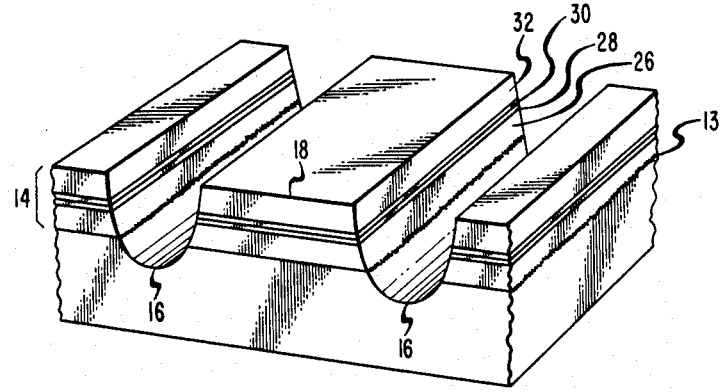
FIG. 2 is a schematic of a portion of the laser of FIG. 1 prior to LPE regrowth and metalization to show the grating on the substrate.

The procedures of Example I were repeated to form a Ru-containing protective coating on the grating etched in the InP wafers, but this time the base structure 14 of a DCPBH laser was grown by LPE over the grating-etched wafers. The base structure, as shown in FIG. 2, comprised a 0.20 $\mu$m thick (average thickness) InGaAsP ($\lambda\simeq1.3$ $\mu$m) waveguide layer 26 doped n-type with Sn to about $7\times10^{17}$/cm$^3$, a 0.20 $\mu$m thick InGaAsP ($\lambda\simeq1.55$ $\mu$m) active layer 28 (unintentionally doped), and a 0.68 $\mu$m thick InP cladding layer 32 doped p-type with Zn to about $1\times10^{18}$/cm$^3$. In this particular example, the p-type anti-meltback layer was not grown, although our later experience found it to be desirable. After suitable masking, channels 16 were etched to form mesa 18 which was about 0.9 $\mu$m wide at the top and 2.6 $\mu$m deep at the bottom of the channels. LPE regrowth was then used to form the embedding structure 20 which included 0.6 $\mu$m thick InP layers 34 doped p-type with Zn to about $1\times10^{18}$/cm$^3$, 0.5 $\mu$m thick InP layers 36 doped n-type with Sn to about $1\times10^{18}$/cm$^3$, a 2.6 $\mu$m thick InP layer 37 doped p-type with Zn to about $1\times10^{18}$/cm$^3$, and a 1.0 $\mu$m thick InGaAs ($\lambda\simeq1.65$ $\mu$m) contact-facilitating layer 38 doped p-type with Zn to about $8\times10^{18}$/cm$^3$. The thicknesses of the layers of the embedding structure were measured in the planar region outside the channels. Electrical contacts 22 and 24 were then deposited as described earlier, and the wafers were cleaved into individual DFB-DCPBH laser chips.

X-ray photoelectron spectroscopy (XPS) showed that the content of the coating had about 1.3 atomic percent Ru, and the coating's coverage of the wafer surface was about 0.06 monolayers or less. Less than complete coverage of the grating surface may be important to LPE growth which generally requires a significant portion of the semiconductor to be exposed in order to obtain adequate wetting of the LPE melt.

The threshold currents of the lasers fabricated from these wafers were essentially identical to those fabricated without the Ru coating, which indicates that the small amount of transition metal present in the structure does not degrade the material or device quality.

EXAMPLE III

The procedures of Example II were repeated to the extent that the base structure was grown, but in this case a Rh-containing protective coating was formed on the grating. XPS showed that the content of the coating had about 0.5 atomic percent Rh, and the coating's coverage of the wafer surface was about 0.06 monolayers or less.

The base structures were optically pumped with a Nd:YAG laser (1.06 μm) so that the active layer 28 lased in a single longitudinal mode. This experiment demonstrated that the base structure was suitable for incorporation into a single-frequency laser.

EXAMPLE IV

The procedures of Example II were repeated in an attempt to grow a base structure, but in this case an Os-containing protective coating was formed on the grating. XPS showed that the content of the coating had about 3.0 atomic percent Os and the coating's coverage of the wafer surface was about 0.15 monolayers.

With the Os coating, the grating was preserved well in heat treatment, but the wafer surface would no longer adequately wet with the epitaxial growth melts. The resulting wafer was covered uniformly with islands of epitaxial growth, typically 1 μm in size, suggesting that too much coverage by the Os coating layer either reduces the density of growth nucleation centers or impedes the coalescence of nucleated islands during growth.

What is claimed is:

1. A semiconductor laser comprising
   a Group III-V compound semiconductor body having a major surface, p1 an optical grating on said major surface,
   a protective coating on said grating, said coating including a transition metal,
   a Group III-V compound semiconductor heterostructure formed on said coating, said heterostructure having the shape of a mesa and including a Group III-V compound semiconductor active layer,
   a current-blocking Group III-V compound semiconductor structure laterally adjacent said mesa and effective to direct the primary flow of current through said mesa during operation of said laser, and
   means forming electrical contact to said laser.

2. The laser of claim 1 wherein said coating contains Ru.

3. The laser of claim 1 wherein said coating contains Rh.

4. The laser of claims 1, 2 or 3 wherein said body comprises InP and said active layer comprises InGaAsP.

5. The laser of claim 4 wherein the composition of said active layer emits light at a wavelength of about 1.5 μm.

6. The laser of claims 1, 2 or 3 wherein said heterostructure further includes a Group III-V compound semiconductor waveguide layer having a bandgap wider than that of said active layer and being optically coupled thereto.

7. The laser of claim 6 wherein said body comprises InP, said active layer comprises InGaAsP and said waveguide layer comprises InGaAsP.

8. The laser of claim 7 wherein the composition of said active layer emits light at a wavelength of about 1.5 μm.

* * * * *